United States Patent [19]

Birk et al.

[11] Patent Number: 4,821,157

[45] Date of Patent: Apr. 11, 1989

[54] SYSTEM FOR SENSING AND FORMING OBJECTS SUCH AS LEADS OF ELECTRONIC COMPONENTS

[75] Inventors: John Birk, Los Altos; Heinz Breu, Mountain View; William Gong, Sunnyvale; Charles C. Morehouse, Cupertino; Sidney Liebes, Jr., Atherton, all of Calif.

[73] Assignee: Hewlett-Packard Co., Palo Alto, Calif.

[21] Appl. No.: 89,651

[22] Filed: Aug. 26, 1987

Related U.S. Application Data

[62] Division of Ser. No. 832,481, Feb. 21, 1986, Pat. No. 4,705,081.

[51] Int. Cl.[4] .............................................. F21V 11/00
[52] U.S. Cl. .................................... 362/241; 362/237; 362/247; 382/8; 356/737; 350/174
[58] Field of Search ............... 362/241, 237, 236, 247, 362/296, 297; 382/8; 356/237; 235/470; 350/174

[56] References Cited

U.S. PATENT DOCUMENTS

| 3,546,438 | 12/1970 | Buc et al. ........................ 362/296 X |
| 4,093,865 | 6/1978 | Nickl .................................... 235/470 |
| 4,272,799 | 6/1981 | Downing ........................ 362/241 X |
| 4,408,266 | 10/1983 | Sclippa ................................ 362/346 |
| 4,450,579 | 5/1984 | Nakashima et al. ................... 382/8 |
| 4,578,810 | 3/1986 | Mac Farlane et al. ................ 382/8 |
| 4,696,047 | 9/1987 | Christian et al. ..................... 382/8 |

OTHER PUBLICATIONS

Asand et al., "Vision System Aligns Leads for Automatic Component Insertion", *Assembly Automation* 2/83, pp. 32-35.
Klass, "Circuit Board Assembly Plant to Test Systems", *Aviation Week & Space Technology*, 8/82, pp. 66-68.
Sanderson et al., "Sensor-Based Robotic Assembly Systems", *Proceedings of the IEEE*, 7/83, pp. 856-871.
Murai et al., "Automatic Insertion of Electronic Components by Optical Detection of Lead Positions", 4th Int. Conf. on Assembly Automation, pp. 390-399, date unknown.
Asano et al., "Vision System of an Automatic Inserter for Printed Circuit Broad Assembly", Publication & Date unknown.
Sanderson et al., "Sensor Based Robotic Assembly Systems", Draft Manuscript, 11/82.
Chisholm et al., "Mass Pin Straightening for Circuit-Pack Backplanes", Western Electric Engineer, Fall 80, pp. 35-40.
Di Lorenzo et al., "Component Position Recognition and Device for an Assembly Robot", IBM Tech. Discl. Bulletin, 12/83, pp. 3664-3666.

*Primary Examiner*—Ira S. Lazarus
*Assistant Examiner*—Richard R. Cole
*Attorney, Agent, or Firm*—Edward Y. Wong

[57] ABSTRACT

An automatic lead sensing and fine-forming system is disclosed for preparing the leads of electronic components so that they are ready to be inserted by robots into holes on printed circuit boards. The positions of the lead tips and the positions of the holes are sensed and compared to determine if any leads need to be bent. These leads are then bent and the force on the leads and their displacement are sensed and recorded during the process. The data recorded in then used for subsequent bendings, where necessary, for bending the leads to the target locations so that all the leads fit simultaneously into the holes. To simplify image processing, the lead tips are illuminated by light originating from substantially isotropic directions from locations substantially coplanar with the region of the lead tips. A telecentric lens system is used in the optical sensing of the position of the lead tips so that measurement of the distances between leads is unaffected by variations in the separation between the lead tips and the sensing device.

5 Claims, 13 Drawing Sheets

SYSTEM FOR SENSING AND FORMING OBJECTS SUCH AS LEADS OF ELECTRONIC COMPONENTS

CROSS REFERENCE TO RELATED APPLICATION

This is a division of application Ser. No. 832,481, filed Feb. 21, 1986, now U.S. Pat. No. 4,705,081.

BACKGROUND OF THE INVENTION

This application relates in general to systems for assembling components and in particular to a system for sensing and forming leads of components. This application also relates to optical systems for illuminating objects and the sensing of objects.

Industrial robots are increasingly being used for assembly work in manufacturing. In one area of assembly work, leads of electronic components are to be inserted into holes on printed circuit boards. When the leads are separated spatially by the correct distances so that they can fit simultaneously into the holes, the leads are said to be in the "drop-in" condition. Frequently, however, the leads are not in the drop-in condition for a wide variety of reasons. The leads may have been bent during handling, shipping or storage or they may not have been formed properly in the first place. If the leads are not in their proper drop-in condition, it will generally be difficult for a robot to insert the leads of the component into holes on printed circuit boards.

A number of solutions to the above-described problem have been previously proposed. In "Vision System Aligns Leads for Automatic Component Insertion" by Asano et al. in *Assembly Automation,* February 1983, pp. 32-35 the solution proposed is to cut the leads to different lengths. The longer lead is then aligned with its corresponding hole and inserted therein. A shorter lead is then aligned with its corresponding hole for insertion. If the spacing between the two leads inserted is not the same as the spacing between their corresponding holes, one of the two leads may be bent while the shorter lead is being aligned with its hole. Essentially the same solution has been proposed by Klass in "Circuit Board Assembly Plant to Test Systems" in *Aviation Week & Space Technology,* Aug. 2, 1982, pp. 66-68, by Sanderson and Perry in "Sensor-Based Robotic Assembly Systems: Research and Applications in Electronic Manufacturing", *Proceedings of the IEEE,* Vol 71, No. 7, July 1983, pages 856-871 and by Murai et al in "Automatic Insertion of Electronic Components by Optical Detection of Lead Positions", Fourth International Conference on Assembly Automation, pages 390-399.

The above described approach is not entirely satisfactory since it may not be suitable for components with many leads. Furthermore, it takes more effort to prepare these staggered leads. These leads remain staggered after insertion on the other side of the printed circuit board, so that they are non-uniform in appearance and cause quality soldering more difficult.

Another popular approach uses special fixtures into which a robot inserts the leads. All the leads are then bent to one side and then another. After the leads are released, most leads will move back by short distances towards the original positions. Such motion of the leads is known as "spring-back". If the leads have been bent beyond their elastic limit or yield points, they will stop short of moving back to their original positions. Distances for which the leads will move back are determined by many factors referred to below as the spring-back characteristics of the leads. Thus, even though all the leads have been bent to the same positions on one side and then the other, they may move back by different distances so that the lead spacings are still different from those in the drop-in condition.

Yet another conventional approach is to use a specialized gripper which pushes leads inward from an initially outward sprung condition. Where a large number of different types of components must be inserted, a large number of special fingers and grippers may have to be designed for their insertion which may be difficult and uneconomical.

None of the above-described approaches are entirely satisfactory. It is therefore desirable to provide a system for sensing and forming leads so that the leads are in the drop-in condition.

In order to detect the positions of the lead tips, appropriate lighting is necessary so that the cross section of the lead tips reflect light uniformly and a clear visual image can be obtained. In "Automatic Insertion of Electronic Components by Optical Detection of Lead Positions" by Murai et al., Fourth International Conference on Assembly Automation, a circular fluorescent lamp is proposed as the light source for illuminating lead tips. Even when such a source is used, it may be difficult to detect the positions of the lead tips. Thus, as described by Murai et al. in the above article, the body of the electronic component may come out as background in a photograph, particularly when the component body is highly reflective of light. To screen out the noise caused by this background Murai et al. developed an algorithm for obtaining the optimum threshold level for light sensing. Thus, while a circular lamp may be advantageous for some reasons, it has disadvantages since it also illuminates the body of the electronic component which causes background noise. It is therefore desirable to provide other illuminating devices to alleviate such difficulties.

SUMMARY OF THE INVENTION

This invention is based on the recognition that the positions of the leads can be matched to the positions of the holes to discover if any leads need to be bent in a process referred to below as fine-forming. Thus, one aspect of the invention is directed towards an apparatus for determining whether any leads of a first component having two or more leads need to be bent in order to fit into predetermined holes in a second component. The apparatus includes means for sensing the positions of the tips of the leads of the first component. The apparatus further includes means for comparing the positions of the leads to the positions of the predetermined holes and for determining from the comparison which leads, if any, need to be bent in order for all the leads of the first component to fit simultaneously into the holes.

After establishing that one or more leads of the first component need to be bent, such lead or leads must then be bent so that all the leads will fit simultaneously into the holes. Thus, another aspect of the invention is directed towards an apparatus for bending a lead of the first component, said component having at least one other lead. The apparatus includes means for detecting the position of a portion of the lead to be bent, and for generating an output signal to indicate the position of the lead portion. The apparatus further includes a controller means for producing a control signal in response to the detecting means output signal and a bending means for bending the lead in response to the control signal so that, after bending, all the leads of the first component can simultaneously fit into the predetermined holes.

Another aspect of the invention is based on the observation that the spring-back characteristic of each lead to be bent can be measured in the bending process itself, so that the proper amount of bending can be applied to assure that the final position of the leads is within a given tolerance of its drop-in position after the bending process has been completed. The spring-back characteristics of a lead can be sensed by detecting both the force on and the displacement of the lead caused by the bending during spring-back. Thus, another aspect of the invention is directed towards an apparatus for bending a lead of a component comprising a bending means for bending the lead of the component in response to a control signal. The apparatus further includes detecting means for detecting the force on the lead by the bending means and its displacement and producing an output signal, and a controller means for producing the control signal in response to the detecting means output signal for controlling the bending means.

Still another aspect of the invention is directed to a device for illuminating a region, such as the region of the lead tips. The device comprises means for providing light in substantially isotropic directions towards said region from locations substantially coplanar with the region so that only the portion of an object in or near the plane of the region and the locations is illuminated without illuminating the remaining portion of the object.

DETAILED DESCRIPTION OF THE INVENTION

Figure 1:
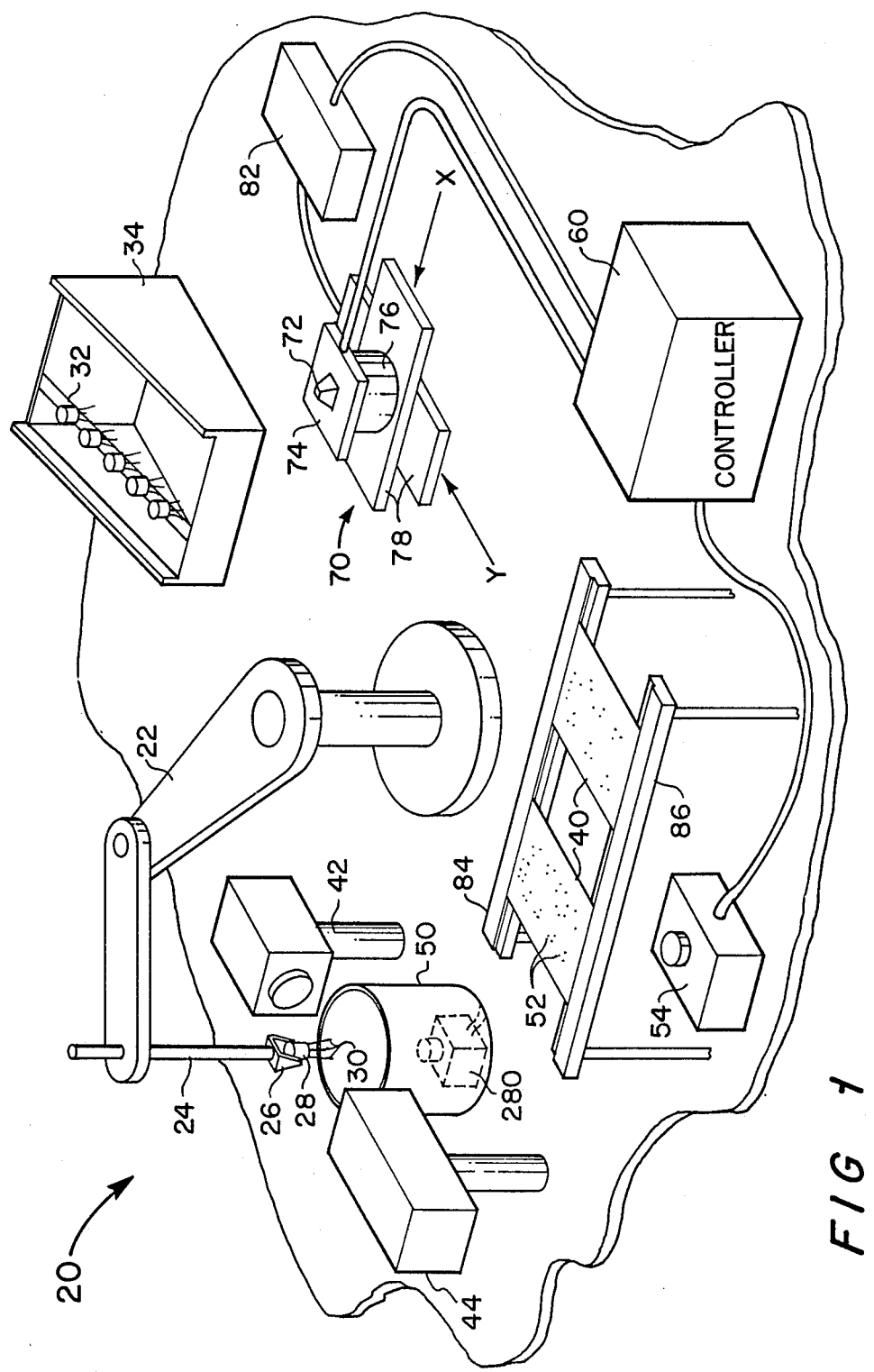
FIG. 1 is a perspective view of a system for detecting the positions of the leads on an electrical component, for fine-forming the leads where necessary and for inserting the leads into a printed circuit board to illustrate the preferred embodiment of the invention.

FIG. 1 is a perspective view of a system for detecting the positions of the leads on an electrical component, for fine-forming (defined below) the leads where necessary and for inserting the leads into a printed circuit board to illustrate the preferred embodiment of the invention. As shown in FIG. 1, system 20 comprises a robot 22 having a robot arm 24 with fingers 26 for handling and gripping electrical component 28 with leads 30. Fingers 26 of robot 22 first pick up a component 28 from a feeder 32 which may be located on a cassette 34. As shown in FIG. 1, feeder 32 is such that the components therein are all located in substantially known orientations so that when the fingers 26 of the robot grip the body of a component, the orientation of the component is known with respect to the frame of reference of the robot. While this is the case in the preferred embodiment, it will be understood that other feeders may be used which do not cause the components to be in a known orientation with respect to the robot. Existing image processing methods can then be applied to detect the orientation of the components with respect to the robot.

Leads 30 of the component 28 have been preformed. In other words, leads 30 have been cut and or bent in such a manner that they are either in the drop-in condition or close to it. If the leads are already in the drop-in condition, no further work needs be done and the robot may simply insert them into the printed circuit board. If they are not, then further work will need to be done on them in a process referred to below as fine-forming.

The positions of the lead tips of leads 30 are sensed using an optical sensing system comprising a light source 42, a light detector such as a camera 44 and a second optical illumination and detection system 50. The positions of the holes 52 on boards 40 into which leads 30 are to be inserted are sensed by means of an optical sensor such as a camera 54. While it is preferable for the tips of the leads to be coplanar, they do not need to be. The same is true for the holes on each board. In the preferred embodiment holes 52 are illuminated by a source (not shown in FIG. 1) above board 40 on the opposite side of camera 54. The positions of the lead tips sensed by detectors 44 and system 50 and the positions of the holes 52 sensed by camera 54 are all supplied to controller 60, where the positions of the lead tips are compared to those of holes 52. From the comparison controller 60 determines whether the tips of leads 30 can be brought to match exactly holes 52; if they do, the leads are then ready to be inserted into holes 52 without any need for bending the leads either before or during the insertion process. When in such condition, the leads are in a condition known as the drop-in condition. Frequently, however, the leads may be bent during storage or handling or they may not have been formed properly in the first place. For these reasons, one or more of leads 30 may have to be bent in order for their tips to be in the drop-in condition. Once the leads are in the drop-in condition, the insertion process can be done automatically and conveniently by the robot.

Where one or more of the leads 30 need to be bent to achieve the drop-in condition, controller 60 compares the positions of their tips to the positions of holes 52 sensed by detector 44, system 50 and camera 54 to determine which lead or leads need to be bent, the distances for which they must be bent and the directions for bending to cause leads 30 to be in the drop-in condition. After the controller determines which leads need to be bent, and the distances and directions for bending such leads, controller 60 causes robot 22 to move component 28 towards a bending and sensing mechanism 70 comprising a bending member 72, and a force sensor 74 to which the bending member is attached. The force sensor is in turn attached to a X-Y table for moving the force sensor and bending member in two mutually perpendicular directions. As shown in FIG. 1 the X-Y table comprises base 76 attached to two cross-slides 78 for moving the bending member 72 and force sensor 74 in two perpendicular horizontal directions X, Y. It will be understood, however, that other conventional constructions for the X-Y table may be used and are still within the scope of the invention. The movement of the cross-slides 78 is controlled by a motor 82 which is in turn controlled by the controller 60. Controller 60 causes motor 82 to drive cross-slides 78 so that the bending member 72 is moved in the X and Y directions for the desired distances for bending leads 30.

When leads 30 are in or are rendered in the drop-in condition, robot 22 translates and rotates component 28 to a position above board 40 until the tips of leads 30 are above holes 52. The robot then inserts leads 30 into their corresponding holes and the insertion process is then completed. Boards 40 are fed by a mechanism (not shown in FIG. 1) on to two rails 84, 86. The mechanism moves each board 40 until it is above camera 54 for detecting the position of holes 521. After all components have been inserted into board 40, the board is moved away and the next printed circuit board is moved to take its place so that the process can be repeated.

Figure 2:
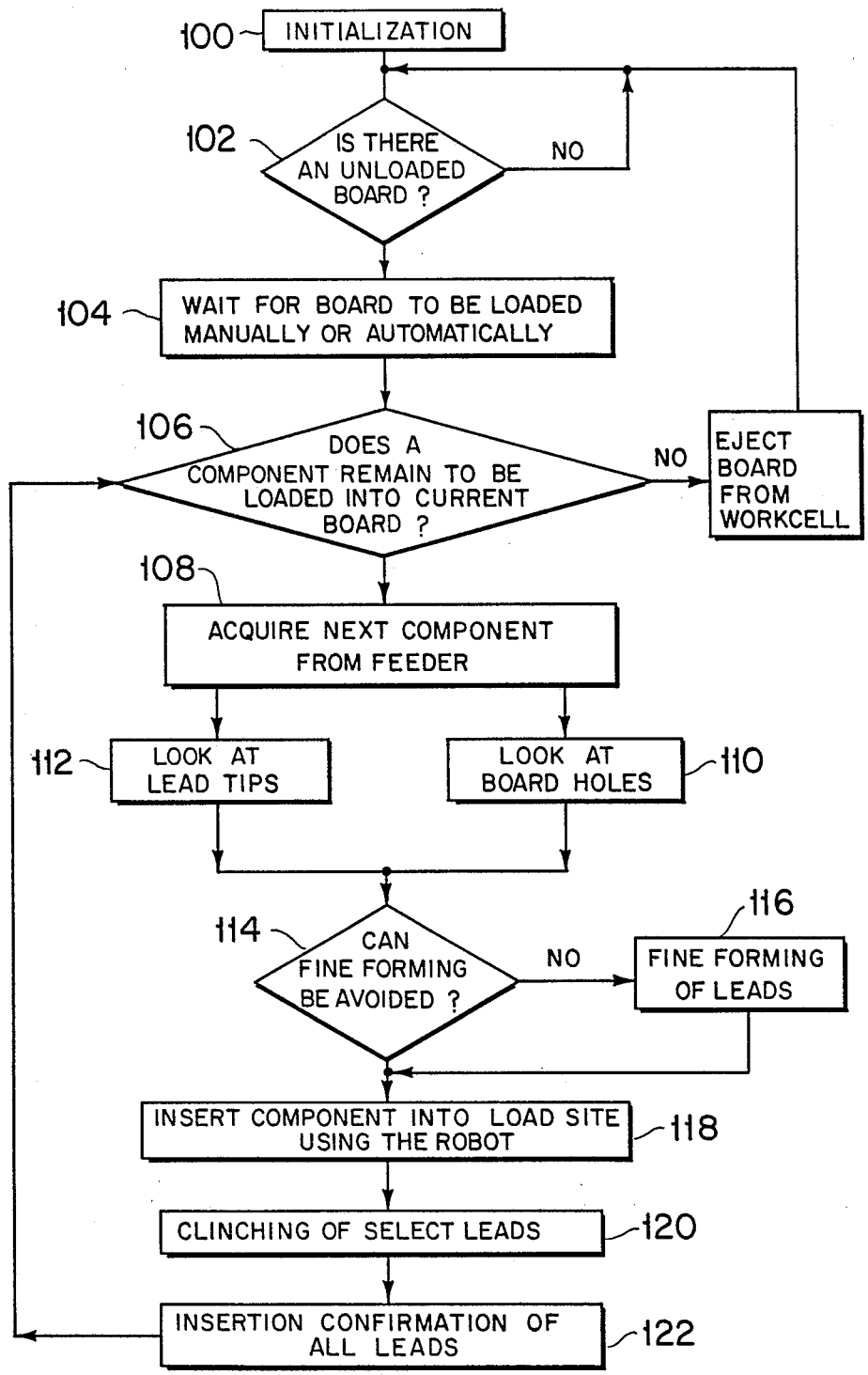
FIG. 2 is a flow chart to illustrate the steps for controlling the system of FIG. 1.

The operation of system 20, including robot 22, is controlled by controller 60. Some of the connections between other components of system 20 and controller 60 have been omitted or truncated to simplify FIG. 1. FIG. 2 is a flow chart to illustrate the steps by which controller 60 controls system 20. The system is first initialized (block 100). If there is an unloaded board system 20 waits until the board is loaded onto rails 84, 86 (diamond 102, block 104). The loading can be performed either manually or automatically in a conventional manner. If there is no unloaded board the system simply loops upon itself and waits until an unloaded board is available. In such manner a board 40 is loaded onto rails 84, 86 above camera 54; which is referred to in FIG. 2 as the current board.

Controller 60 then checks to see if a component remains to be loaded into the circuit board (block 106). If a component still has to be loaded, controller 60 causes robot 22 to acquire a component from feeder 32 by means of fingers 26 (block 108). Controller 60 then causes robot 22 to move the component 28 to a position between the illumination source 42 and detector 44 and causes the illumination source 42 to illuminate the component. The illumination source (not shown in FIG. 1) for illuminating board 40 is also turned on. The approximate height of the tips of leads 30 below fingers 26 of the robot are detected by detector 44. The positions of holes 52 are also detected by sensing system 54 (block 110). Robot 22 moves the component 28 into an illuminating and sensing system 50 for detecting the positions of the tips of leads 30 (block 112). Controller 60 then compares the positions of the lead tips to the positions of the holes 52 to determine whether the leads are in the drop-in condition. If they are, then fine-forming can be avoided; if not, fine-forming is then performed (diamond 114, block 116). In either case leads 30 are then in the drop-in condition and controller 60 instructs robot 22 to insert leads 30 into holes 52 (block 118). Excess protruding portions of the leads are then clinched and the insertion of all leads are then confirmed in a conventional manner (blocks 120, 122). The assembly process is then completed. The operation of robot 22 and the transformation between different reference frames of the robot and those of the optical and force sensing components of system 20 is conventional. An explanation of robot operation and frame of reference transformation may be found, for example, in *Robot Manipulators: Mathematics, Programming and Control,* by Richard P. Paul, The MIT Press, Cambridge, Mass., 1981.

The manner in which the positions of lead tips and board holes are compared for determining which leads need to be fine-formed will now be described in reference to FIGS. 3, 4A-4D. As will be clear from the description below, the process of finding which leads need to be fine-formed also determines the distances and directions for bending such leads so that all the leads are in the drop-in condition.

As described above in reference to FIGS. 1 and 2 the positions of holes 52 are sensed by means of system 54 and the positions of the lead tips are sensed by means of system 50. These same steps are referred to in FIG. 3 by the same block numbers (blocks 110, 112) as in FIG. 2. Where the positions of the holes are not sensed but originate by computer aided design (CAD) such positions are stored in controller 60 or supplied to it. The positions of the holes and the positions of the lead tips are then compared to determine if any of the leads need to be fine-formed. In the comparison, if the distances between holes and between lead tips are large compared to the internal dimensions of the holes and lead tips, the internal dimensions of the tips and holes may be ignored and the holes and lead tips simply treated as points in the comparison. In some cases, the internal dimensions of the holes and lead tips may be comparable to such distances. For example, the holes may be of the order of 20 mils whereas the distances between holes are of the order of 100 mils. In such circumstances it is necessary to compute the centers of the holes and lead tips (block 114). The centers of the holes and lead tips are then compared for determining if any leads need to be fine-formed.

A conventional method for finding the centers of holes and lead tips may be used to determine the centers of holes and lead tips. Thus, where the sensing systems 50, 54 each comprises a television camera, the images of the lead tips and holes are detected in terms of light intensities at different pixels of the camera. First, pixels with light intensities between certain preset intensity levels are identified. In one conventional method known as the connectivity method, each pixel identified is given a unit weight and the center of mass of the set of pixel points are then computed as described by A. Rosenfeld and A. C. Kak *Digital Picture Processing,* 2nd Section, Academy Press, New York 1982, vol. 2, pp. 241-242. In another conventional method known as the boundary method, the pixels detecting light intensities between two intensity levels are enclosed by a chain-encoded polygon. The center of mass of the polygon is then found by a conventional method as described in "Computer Processing of Line-Drawing Images" by Herbert Freeman in *Computing Surveys,* Vol. 6, No. 1, March 1974 pp. 57-97.

In the description below, the terms "hole centers" and "lead tip centers" may be point positions computed in accordance with any one of the accepted conventional methods, such as the two methods referenced above. In the description to follow, where the internal dimensions of the holes and lead tips are significant compared to the distances between holes and lead tips, the distance between two holes will mean the distance between the centers of such holes and the distance between two lead tips will mean the distance between the centers of such tips.

The algorithms for comparing the lead tips to the holes for determining which leads need to be bent can be best understood by imagining a manual process for accomplishing the same task. Thus, in trying to identify which leads need to be fine-formed, an observer must first try to identify the hole corresponding to a particular lead so that the lead can be inserted into such hole. Thus, in block 116, controller 60 matches each lead tip with a hole using a conventional correspondence algorithm. One such algorithm, the Hungarian method for the assignment problem, is described for example by C. H. Papadimitrion and K. Steiglitz in *Combinatorial Optimization: Algorithms and Complexity,* Prentice-Hall, Englewood Cliffs, N.J., 1982.

Using such conventional method, a one to one correspondence is set up between an unordered list of holes and an unordered list of leads. The center of mass of the list of holes is found and the center of mass of the list of lead tips is also found. Each list is then normalized by translating the centers of mass to the origin of a reference frame. The principal axis of each list of holes or lead tips is found as described by Rosenfeld and Kak in their book referenced above. The list of holes are then rotated until the list of holes have the same principal axis as the list of lead tips. A weighted bipartite graph is constructed whose vertices are the list of hole and lead tip centers and whose edges each traveling between a hole center and a lead center. Each edge has a weight which is proportional to the negative distance between the hole and the lead for such edge. The different steps described so far for matching a lead tip to a hole may be referred to as normalization.

In the weighted bipartite graph, each lead tip may be matched with any one of the holes. Each lead tip is matched with a hole so that the sum of the edges between the matched lead tips and holes is maximum. In other words, each lead tip is matched to a hole such that the sum of the distances between the holes and lead tips is minimized. Such matching may be performed in a conventional manner, for example, by applying the above-referenced Hungarian method. Intuitively, this means that each lead tip is matched to a hole such that the lead tips can be matched to the holes by traveling the smallest distances. While the above described algorithm for matching a lead tip to a hole may be preferable, other correspondence algorithms may be used and are within the scope of the invention.

The steps to find which leads, if any, need to be bent will now be described in reference to blocks 118-124 of FIG. 3 and FIGS. 4A-4D. According to block 118, an association graph is constructed. The manner for constructing an association graph will now be described in reference to FIGS. 4A-4C. For the purpose of discussion, assume that five leads L1-L5 of FIG. 4B are to be inserted into five holes H1-H5 of FIG. 4A. A comparison to the five leads to the five holes will indicate that the leads L1-L3 are in position to fit into holes H1-H3 without bending, and only leads L4, L5 will need to be bent. A correspondence algorithm is applied to identify each lead tip with a hole. Thus applying the correspondence algorithm described above, each lead tip Li will be identified with the hole Hi, i=1 ..., 5. Each pair of corresponding hole and lead tip (Hi, Li) form the ith node Ni of the association graph. The tolerances will normally depend on the internal dimensions of the holes and leads. Thus, node N3 is the pair (H3, L3). The distance between each pair of holes is then compared to the distance between each pair of corresponding lead tips. If the two distances are equal within certain preset tolerances, a line is then drawn between the corresponding two nodes of the association graph. Thus, since the holes H1-H3 match lead tips L1-L3, the distance between any two of the three holes will be equal to, within certain tolerances, the distance between the two corresponding tips. Hence lines are to be drawn between the three notes N1, N2, N3. The distance between holes H2, H4, however, is different from the distance between lead tips L2, L4. For this reason no line can be drawn between the nodes N2, N4. The distance between holes H3, H5 is equal within certain tolerance the distance between tips L3, L5. For this reason a line can be drawn between nodes N3, N5. Applying the same principle to all holes and tips, the association graph of FIG. 4C is obtained.

A clique of an association graph is a group or clique of nodes, provided that each node in the clique is connected to every other node in the clique by a line. In the association graph of FIG. 4C, for example, a clique comprises the node N1, N2, N3. While there are cliques having two nodes such as the clique comprising nodes N1 and N3, such cliques are smaller than the clique comprising the three nodes N1-N3. The addition of any other node to the three nodes will cause at least two of the nodes in the four nodes to be unconnected therebetween. That is, the clique is maximal. Furthermore, there are no other cliques with more nodes. Thus, the clique comprising nodes N1-N3 is then the largest or the maximum clique. In some cases, particularly where many lead tips and holes are involved, there may be more than one maximum cliques with the same number of nodes. When a particular lead tip is in a maximum clique, this means that the distance between it and other lead tips also in the clique are equal, within tolerances, to those between corresponding holes. Thus, these leads are in position to fit into the corresponding holes without fine-forming. Therefore, the lead tips not in a maximum clique are the ones needing fine-forming. Nodes N4, N5 corresponding to lead tips L4, L5 are not in the maximum clique. Therefore it is determined that the leads having tips L4, L5 will need to be fine-formed. This matches the intuitive comparison of the holes and leads in FIGS. 4A, 4B described above.

Since the leads have been preformed, in most cases, only a small proportion of leads among all the leads of a component needs to be fine-formed. For this reason, it is usually faster and thus more economical to first determine the leads that need no fine-forming by a method such as finding the maximum clique described above.

The remaining leads then are the ones needing fine-forming. It is, of course, possible to first find instead the leads that need fine-forming by an alternative conventional algorithm; such processes are also within the scope of the invention.

If the five leads having tips L1–L5 are in the drop-in condition, it will be noted that the maximum clique will include all the lead tip centers. Thus, if all lead tip centers are in the maximum clique found, all the leads are in the drop-in condition and fine-forming can be avoided. If at least one lead tip is not in the clique, it indicates that at least one lead will need to be bent so that fine-forming cannot be avoided.

Maximal cliques have been used in conventional methods for matching machine parts. Thus, Robert C. Bolles describes one such technique in "Robust Feature Matching Through Maximal Cliques", *Proc. SPIE Technical Symposium on Imaging and Assembly*, Washington, D.C., April 1979, pp. 1–9.

Figure 3:
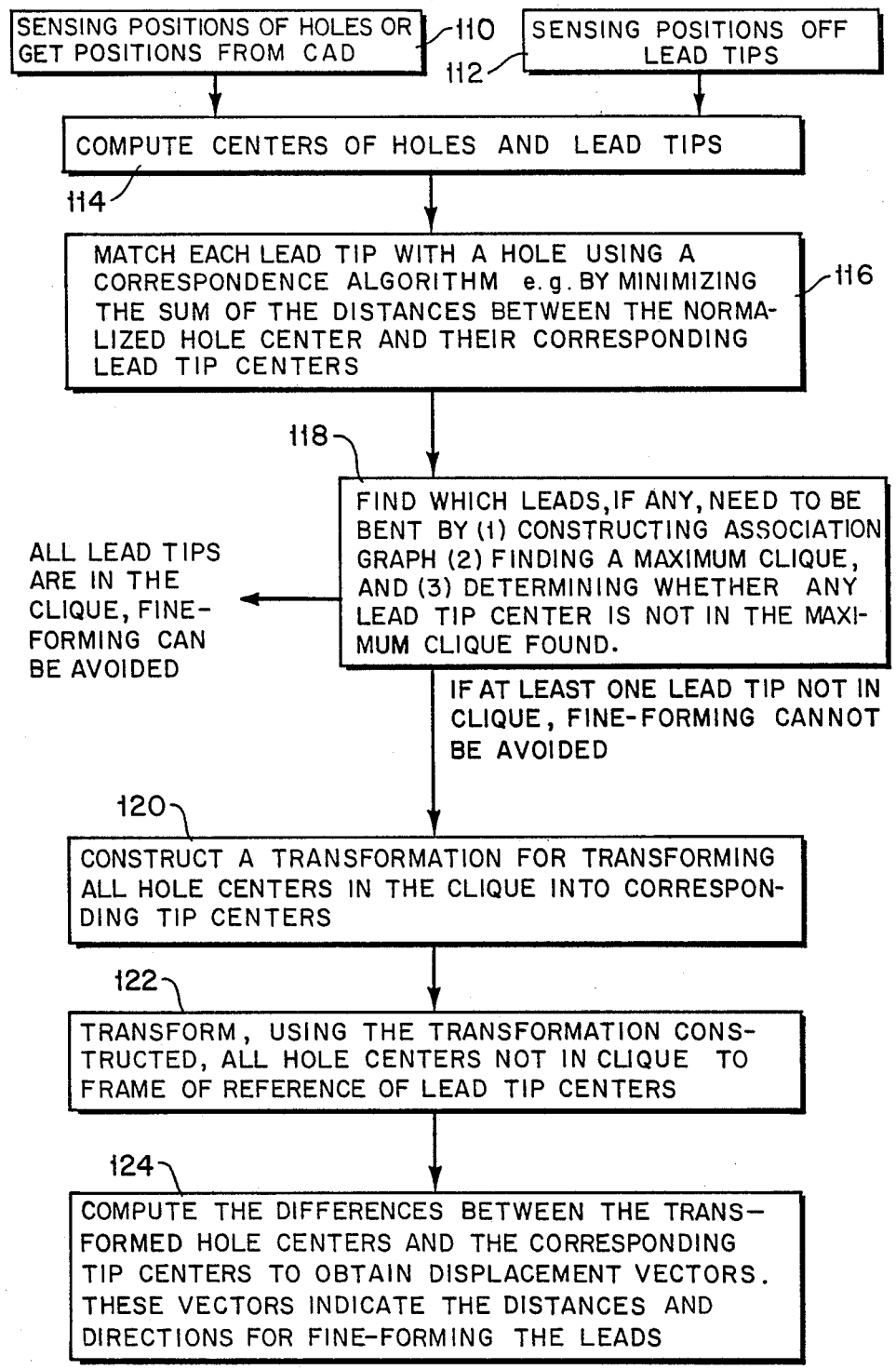
FIG. 3 is a flow chart illustrating an algorithm for identifying which leads, if any, need bending to illustrate the preferred embodiment of the invention.
Figure 4A:
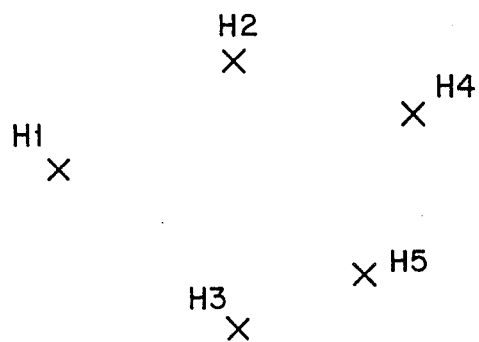
FIGS. 4A–4D are schematic diagrams which together with the flow chart of FIG. 3, illustrate an algorithm for finding which leads need bending.
Figure 4B:
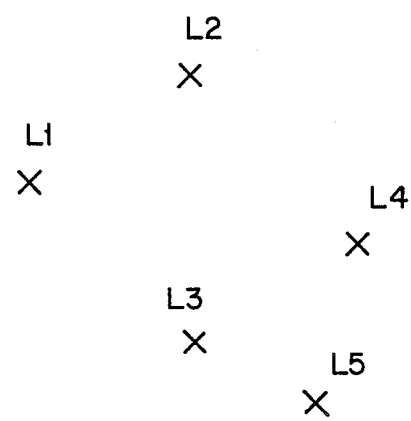
Figure 4C:
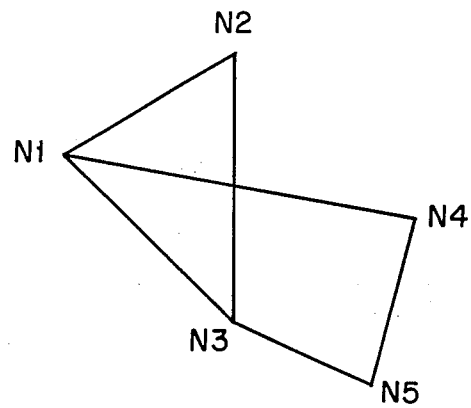
Figure 4D:
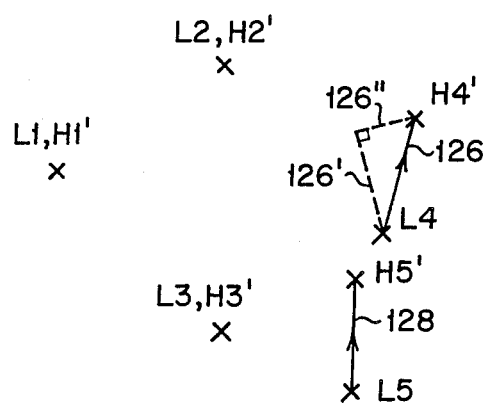

Next, controller 60 constructs a transformation for transforming all hole positions in the maximum clique into the corresponding lead tips (block 120, FIG. 3). Again in reference the FIGS. 4A, 4B, controller 60 finds a transformation which causes holes H1–H3 to coincide with lead tips L1–L3. These transformed hole positions in the frame of reference of the lead tips are shown in FIG. 4D and labeled H1′–H3′. The transformation so constructed is also used to transform holes not in the clique. In reference to FIGS. 4A, 4B, 4D, holes H4, H5 are transformed into positions H4′, H5′ in FIG. 4D. In other words the five holes are transformed into the frame of reference of the lead tips. The vectors 126, 128 of FIG. 4D are then the displacement vectors indicating the distances and directions for fine-forming the leads for tips L4, L5. In other words if the lead with tip L4 is bent until the tip center coincides with the transformed hole center position H4′, and the lead with tip center L5 bent until the tip center coincides with H5′, all the leads will then be in the drop-in condition.

The process above described in reference to FIGS. 3 and 4 gives the answer to the question in diamond 114 in FIG. 2. If all the lead tips are in the maximum clique then fine-forming can be avoided and robot 22 of FIG. 1 brings the component to a position above holes 52 and proceeds to insert the component on to the board 40 as described. Where fine-forming cannot be avoided robot 22 brings the component 28 towards the bending and sensing system 70 for fine-forming the leads.

The process of fine-forming the leads will now be described in reference to FIGS. 5, 6, 7A and 7B. As described above in reference to FIGS. 3, 4A–4D, controller 60 determines the displacement factors 126, 128 for fine-forming the leads with tips L4, L5. Thus, controller 60 has stored in its memory the distances and directions for bending each lead that needs to be fine-formed. For simplicity, component 28 is shown to have only three leads with only one lead needing fine-forming. It will be understood, of course, that the process described below may be used to fine-form more than one lead in the same manner.

Instead of bending a lead along the direction indicated by the displacement vector, such as vector 126, it is possible to bend the lead first along the direction 126′, and subsequently along the direction 126″ for such distances that the three sides 126, 126′ 126″ form a right angle triangle as shown in FIG. 4D. The consecutive bendings are found to cause the final position of the lead tip center L4 to be the same as if it had been bent once along vector 126. Hence, the robot may accomplish the bending in two fixed X, Y directions irrespective of the orientations of the displacement vectors 126, 128. This may eliminate certain robot maneuvers which may be advantageous.

Figure 5:
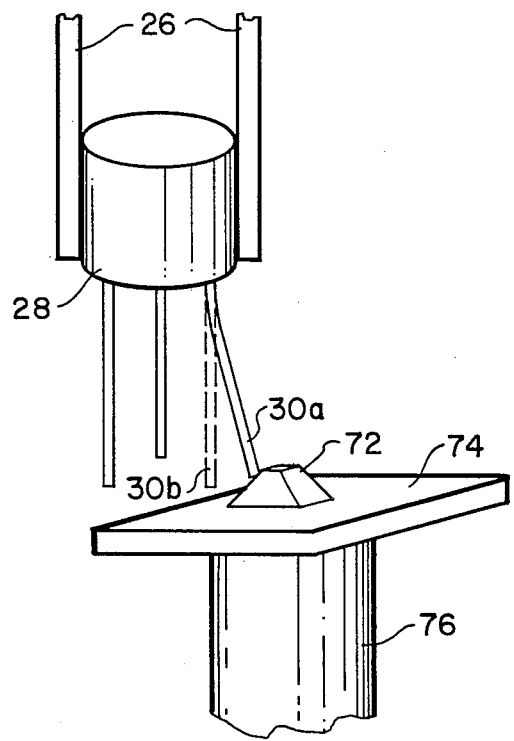
FIG. 5 is a simplified perspective view of a portion of the system of FIG. 1 to illustrate the fine-forming of a lead.

Controller 60 causes robot 22 to move component 28 with respect to bending member 72 so that member 72 is in the proper position for bending lead 30a that needs fine-forming. Frequently, however, leads have elastic and plastic properties so that after they are bent, they will spring-back for a distance after the bending member 72 is removed, so that even after bending, the three leads of component 28 will not be in the drop-in condition. The position 30b in dotted lines in FIG. 5 is the desired position of lead 30a in order that the three leads of component 28 be in the drop-in condition.

Thus, if bending member 72 bends lead 30a until it is in position 30b, after member 72 is removed, lead 30a will spring-back for a short distance so that it is no longer in position 30b. In many cases the leads will spring-back for a sufficient distance so that it is no longer in a preset tolerance limit for insertion into corresponding holes on the printed circuit board 40. This invention is also based on the recognition that the leads may be bent successively until it is within the tolerance limit of the desired position.

Figure 6:
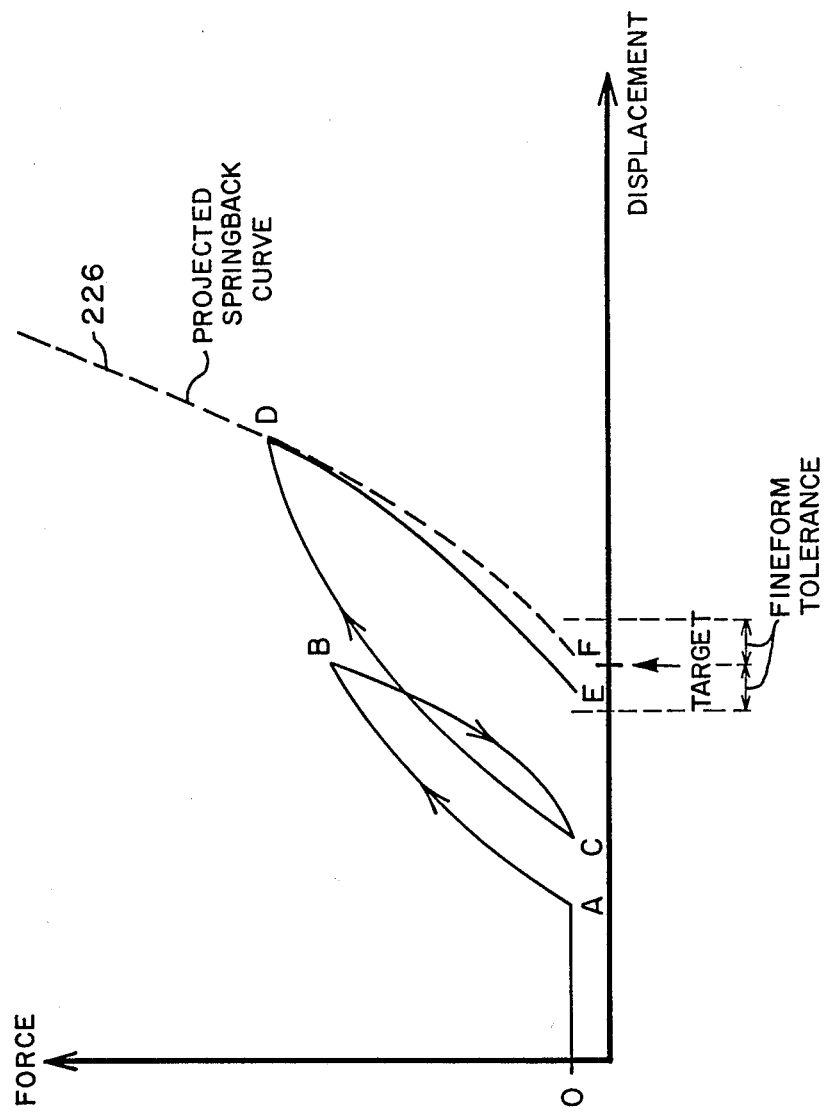
FIG. 6 is a graph of the force exerted on the lead by a bending means as a function of the displacement of the lead to illustrate the steps for bending the lead to a desired target position.

This invention is also based on the observation that, irrespective of the distance for which lead 30a is bent, the spring-back characteristics of a lead remains nearly the same even if successively bent. This is illustrated for example in FIG. 6. FIG. 6 is a graph illustrating the spring-back characteristics in terms of the force exerted by member 72 on lead 30a as a function of the displacement on the tip of the lead from its initial unbent position. As shown in FIG. 6, lead 30a is bent two times, first from point A to point B. When released gradually, the lead spring-backs to point C. The lead is then again bent from point C to point D and again released, allowing it to spring-back to point E. As illustrated in FIG. 6, the shape of the force versus displacement spring-back curve or characteristic from B to C is nearly the same shape as that portion of the spring-back curve from D to E that is below the force valve at B. Thus, if the force versus displacement spring-back curve from B to C is recorded by controller 60, the same shaped spring-back curve can be constructed to through the target point F and suitably extrapolated (curve 226). Upon re-application of force at C, force and displacement are continuously sampled and measured until intersection with curve 226 at point D is achieved. Force is then released allowing the lead to return to point E. If the distance between E and F is less than the established tolerance limit, fine-forming is completed; else the process is iterated. The procedure is illustrated below in reference to FIGS. 6, 7A, 7B.

Figure 7A:
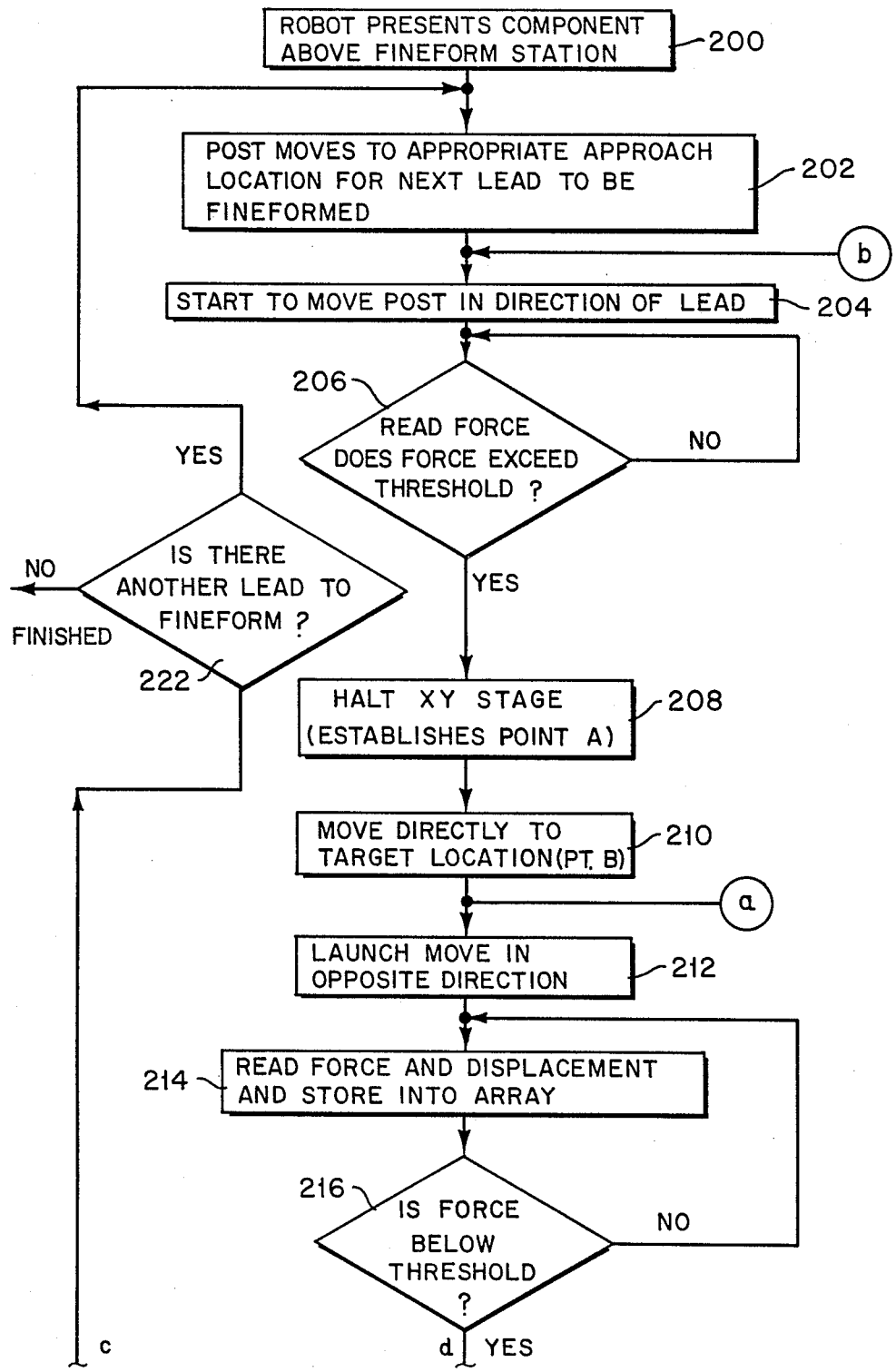
FIGS. 7A, 7B together comprise a flow chart showing the steps of fine-forming a lead to illustrate the preferred embodiment of the invention.
Figure 7B:
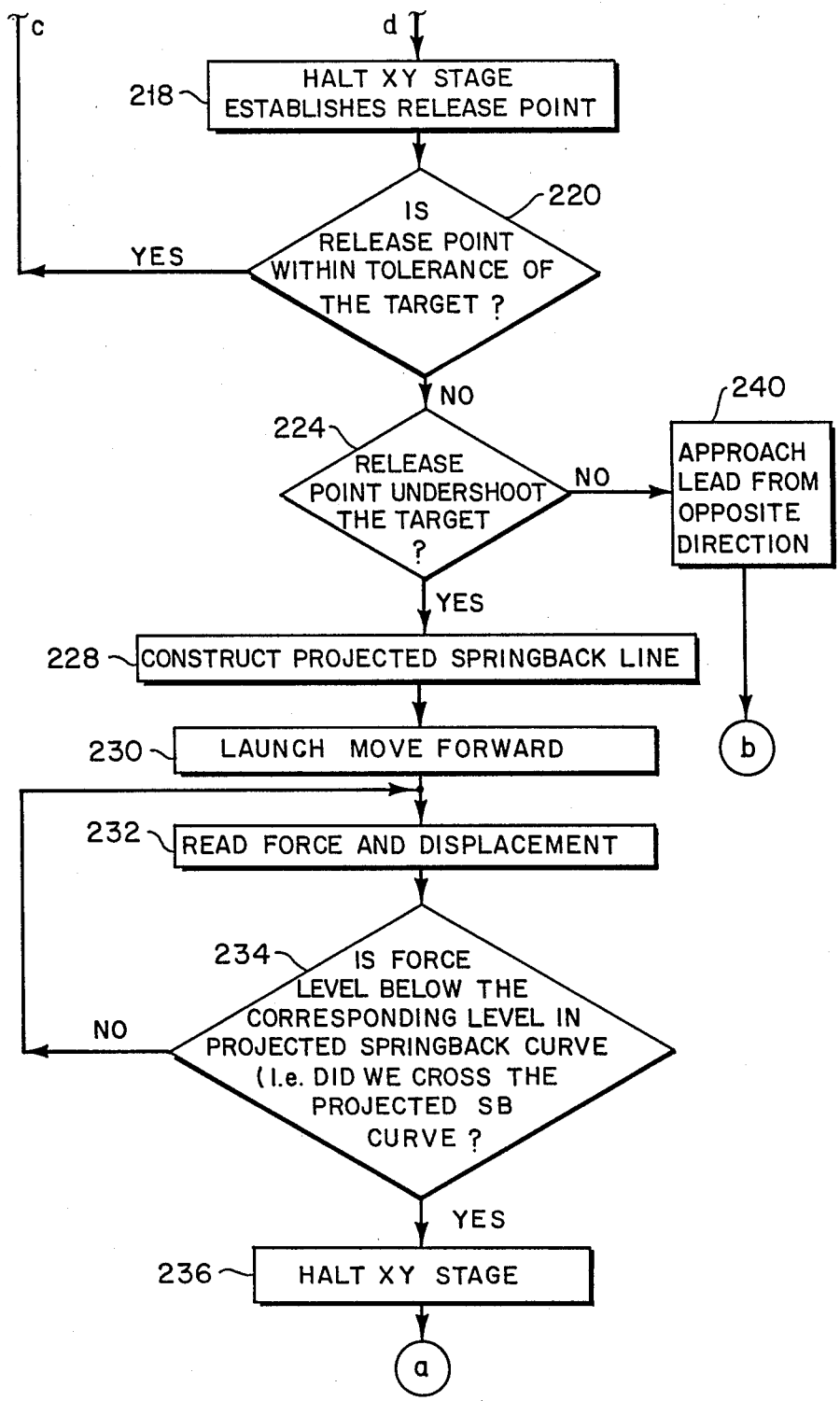

FIGS. 7A, 7B together comprise a flow chart illustrating the steps for fine-forming a lead to illustrate the preferred embodiment of the invention. First the robot 22 presents the component above the fine-forming station at the bending and sensing station 70 in reference to FIG. 1 (block 200). The bending member 72 then moves to the appropriate approach location for the next lead to be fine-formed (block 202). Post 72 is then moved in the direction of the lead (block 204). The force exerted by post 72 on the lead is detected by force sensor 74, which in the preferred embodiment may be a piece of piezoelectric crystal. The force reading from sensor 74 is supplied to controller 60. When the force exerted on the lead is detected to exceed a threshold, the controller causes motor 82 to stop the movement of the post 72 to establish point A in the graph of FIG. 6. The above described motion of the bending post 72 is represented by the horizontal straight line OA in FIG. 6.

As described above, controller 60 has stored therein the displacement vector. The controller then computes the distance along the X or Y direction (FIG. 1) for moving the lead so that the consecutive bendings along the X, Y directions will give the result for bending the lead along the vector. Thus, the controller computes the target location for the lead along the X or Y direction. Next controller 60 causes motor 82 to drive the cross-slide 78 so that the post 72 causes the lead 30a to move directly to the target location (block 210). Upon reaching such point (point B in FIG. 6) bending post 72 is caused to move in substantially the opposite direction to the previous bending direction. The force on the lead and the displacement of the lead from its original and unbent position at point A are sampled and recorded by the controller (block 214). Such movement of post 72 is continued until the force exerted on the lead is detected to fall below the present threshold, thereby establishing a release point C (diamond 216, block 218). Controller 60 therefore records the spring-back characteristics of the lead from point B to point C in FIG. 6.

The controller then checks to see if release point C is within a preset tolerance level of the target location for the lead. If the release point is within such tolerance, the controller causes the cross-slides 78 to move along the other of the X, Y directions so that the two consecutive bendings in the X, Y directions achieves the same result as the bending along the displacement vector. If, upon completing such process, the lead tip center is within tolerance of the point indicated by the displacement vector, the controller then checks to see if another lead needs to be fine-formed. If no lead needs to be fine-formed then the process is completed. If another lead has yet to be fine-formed (diamond 222) the controller returns to block 202 to start the process all over again.

If, however, the release point during bending in the X or Y direction is not within the tolerance of the target, the controller will proceed to diamond 224 in FIG. 7B. The controller checks to see if the release point has undershot the target. If the release point is detected to have undershot the target, the controller first constructs a projected spring-back line, such as line 226 in FIG. 6 (block 228). The force-displacement characteristics of FIG. 6 illustrates a condition where the release point C is not within the fine-forming tolerance, and further that the release point has undershot the target.

The projected spring-back curve is simply constructed by a curve of the same shape as curve B-C but displaced from the right from point A by the target displacement distance. Since generally it is necessary to bend the lead beyond the previous displacement from A to B, it is necessary to extrapolate the projected spring-back curve upwards as shown in FIG. 6 beyond the corresponding force level of point B. This may be done by continuing the curve along the slope of the curve at point B. Since the determination of the slope of the curve at point B may be affected by noise, the slope determined by point B and an intermediate point (e.g. midpoint) between B and C may be used instead to improve accuracy.

After the projected spring-back line has been constructed, controller 60 causes the bending post 72 to bend lead 30a in the same direction as before towards point D (block 230). The force on the lead and the displacement of the lead are sampled and recorded (block 232), preferably at a high frequency for improved accuracy. The controller detects the point at which the bending force crosses the projected spring-back curve. This can be performed by comparing the force on the lead detected at a particular displacement to the force level for the same displacement on the projected spring-back curve. When the force levels are equal or when they cross over, the position of the lead establishes the point D (diamond 234). At this point the motion of the bending and sensing means 70 is stopped (block 236) and the system returns to point a in FIG. 7A causing the lead to move back to a new release point E. If the new release point is within the tolerance of the target, the bending process for such lead is then completed. If the new release point is still not within the tolerance limit of the target, the above process can be repeated until a new release point is within such limit, using a spring-back curve extrapolated from curve D-E in the same manner as that of curve B-C described above.

If in diamond 224, it is detected that the release point has not undershot the target, this means that the previous bending has overshot the target. In such event it is necessary to bend the lead from an opposite direction (block 240). The system then returns to point b in FIG. 7A to start the process all over again but from an opposite direction. Since the target location is stored in the controller, bending the lead again in an opposite direction poses no problems.

In the preferred embodiment described above, both force on and displacement of the lead are measured. Alternatively, only the force on the lead needs to be measured where the spring-back characteristic of a lead made from a particular material is generally know. Such characteristic may be stored in controller 60. The controller computes according to the characteristic the force corresponding to the spring-back distance required so that, after spring-back, the lead tip is within the tolerance limit of the target location. When the force detected by sensor 74 of FIG. 1 is equal to or exceeds the force computed, the lead is released and allowed to spring-back. Similarly, if the spring-back characteristic of the lead is known, measuring only the displacement will suffice. Such alternative configurations are within the scope of this invention.

In the description above in reference to FIG. 1, the positions of the tips of leads 30 and of holes 52 are sensed by system 50 and camera 54. As described above, holes 52 are illuminated from above and light passing through holes 52 are sensed by camera 54 below. The image sensed by camera 54 then appears as bright spots on an uniformly dark background so that the images of the holes can be identified readily. To sense the tips of lead 30, however, is much more difficult. As described in the background of the invention section, circular fluorescent lamps have been used to illuminate lead tips for image sensing and analysis. The body of the electronic component often appears as background noise so that special techniques must be applied to screen out such noise.

This invention is also based on the observation that if only the lead tips are illuminated and not the body portion of the components or other portions of the leads, then much of the background noise superimposed upon images of the lead tips is eliminated. Thus, another aspect of the invention is directed towards a device for illuminating a region. The device comprises means for providing light in substantially isotropic directions towards the region from locations substantially coplanar with the region. Therefore, when a portion of the object is placed in or near the plane of the region and the locations, only such portion of the object is illuminated without illuminating the remaining portion of the object. The reduction in background noise makes the subsequent image analysis of the lead tips much easier.

The light provided is in substantially isotropic directions from locations substantially coplanar with the illuminated regions so that irregularly shaped objects such as lead tips will be uniformly illuminated and also that shadows are not cast by objects inserted in the paths of some of the light beams. This is important since in most cases, electronic components will have more than one lead. Hence, if the illumination is not isotropic in the plane around the lead, one lead may cast a shadow on the other lead causing loss of image of the other lead or other optical errors.

Figure 8:
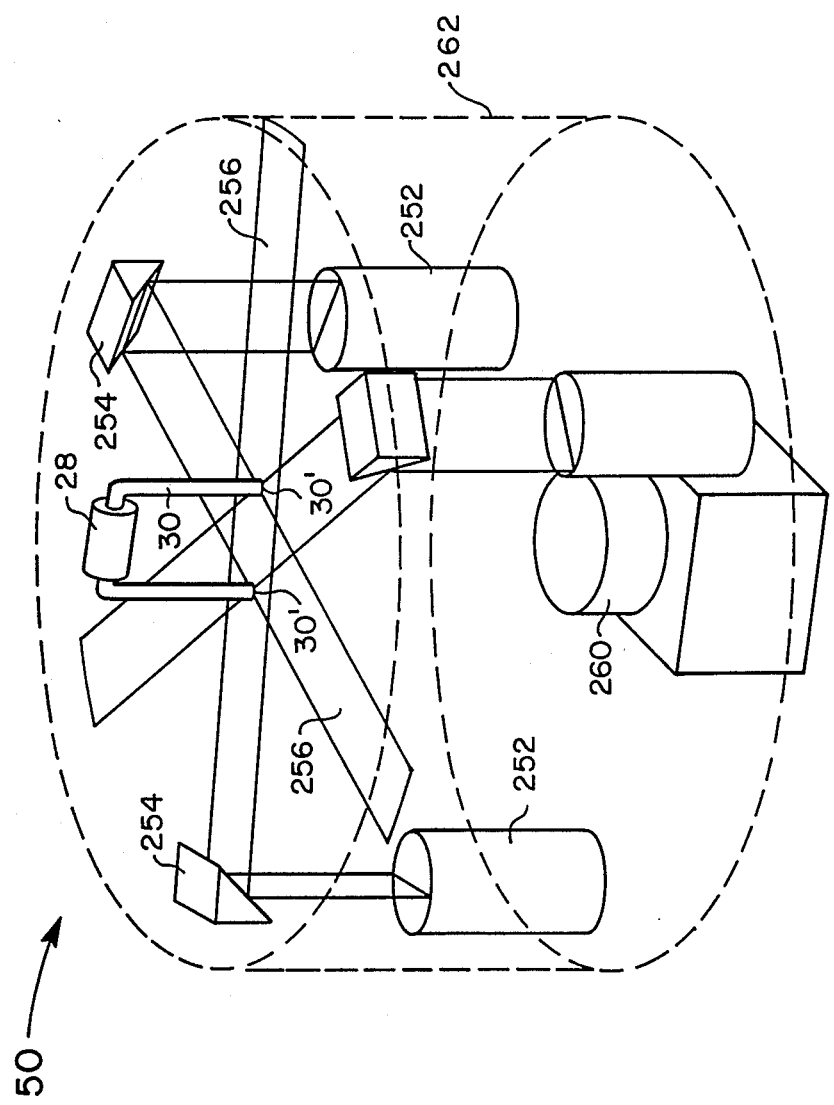
FIG. 8 is a simplified perspective view of an illumination system suitable for use in the system of FIG. 1 in which background optical noise is reduced to illustrate the preferred embodiment of the invention.

System 50 of FIG. 1 is such that it provides an illumination source of the type described above. FIG. 8 is a simplified perspective view of system 50 of FIG. 1, illustrating the preferred embodiment of the invention. As shown in FIG. 8 the tips of leads 30 of component 28 are to be illuminated by system 50. To reduce background noise, it is desirable to illuminate lead tips 30' without illuminating the body of component 28 or other portions of leads 30. To provide substantially isotropic lighting of a region enclosing only the lead tips but not the remaining portion of the component three light sources 252 are used to provide three light beams. The three light beams are reflected by means of three mirrors 254 so that the reflected light beams 256 are directed towards the region of lead tips 30' in three different directions. To provide substantially isotropic lighting of the lead tips, it is preferable for the three mirrors 254 to be evenly spaced around the region of the lead tips. As shown in FIG. 8, mirrors 254 are spaced approximately 120 degrees apart, that is, at evenly spaced angular separations.

While only three sources and mirrors are used in the embodiment of FIG. 8, it will be understood that a larger or smaller number of sources may be used provided that they provide illumination without causing the leads to cast shadows upon one another or irregular surfaces of the leads to do so. All such configurations are within the scope of the invention.

It is desirable to illuminate only the tips of the leads 30' and avoid as much as possible the illumination of the other parts of the component. For this reason, it is desirable for the light beams 256 and the locations of the reflections at mirrors 254 to be substantially coplanar with the region of the lead tips. It is further desirable that the light beams 256 themselves to be in the shape of thin sheets and for all three sheets to be coplanar with the region of the lead tips. Such a configuration is shown in FIG. 8. Thus, the light sources 252 provide light beams in the shape of thin sheets traveling upwards. Upon reflection at the three mirrors 254, the three thin sheets 256 becomes essentially coplanar with the lead tips 30'. In such manner only a minimal portion of the leads 30 aside from the lead tips are illuminated, which reduces the background optical noise to a minimum. The light reflected by tips 30' are sensed by a camera 260 and the images so sensed are analyzed and utilized in a manner described above. Mirrors 254 may be conveniently mounted on a cylinder 262 for support.

Figure 9:
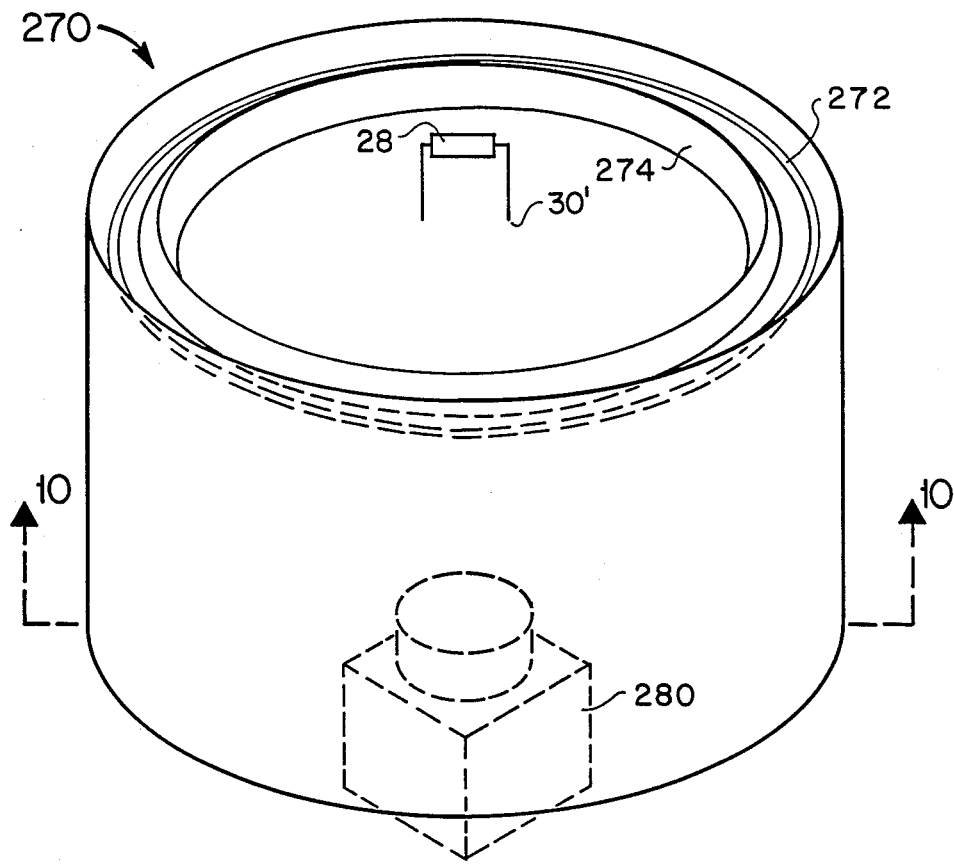
FIG. 9 is a perspective view of an illumination system suitable for use in the system of FIG. 1 to illustrate an alternative embodiment to that shown in FIG. 8.
Figure 10:
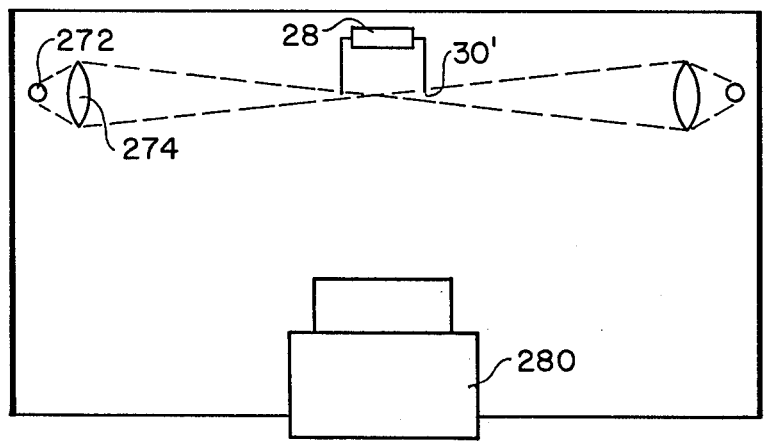
FIG. 10 is a cross-sectional view along the line 10—10 in FIG. 9.

FIG. 9 is a perspective view of an illumination system to illustrate an alternative embodiment to that shown in FIG. 8. As shown in FIG. 9 the light source may be a circular lamp 272 of the type described by Murai et al. in the paper referenced above. The light emitted from source 272 towards component 28 are focused by a toroidal lens 274 into a thin sheet of light with the thinnest point at tips 30' as shown more clearly in FIG. 10. FIG. 10 is a cross-sectional view along the line 10—10 in FIG. 9. By using a toroidal lens 274, light which otherwise causes the body and other portions of component 28 to be illuminated are now focused by the lens towards lead tips 30'. Therefore, again means for providing light in substantially isotroptic directions from locations substantially coplanar with the tips towards the region of the lead tips is provided.

In reference to FIG. 1 robot 22 carries component 28 to a position on top of system 50 for sensing the positions of the lead tips. Variations in the lengths of leads and orientations of components may cause the lead tips to be at different vertical distances from the light sensors in system 50. Typically system 50 employs a camera for sensing the lead tips. As described above, it is important to sense the actual distances between lead tips so that the leads that need fine-forming can be discovered. If the distances between the lead tips and the camera vary, this may cause the sensed distances between lead tips to be in error. For this reason it is desirable to use an optical system where the distance between lead tips can be sensed accurately irrespective of the separation between the lead tips and the camera 280. For this purpose a telecentric lens system can be used as illustrated in FIG. 11.

Figure 11:
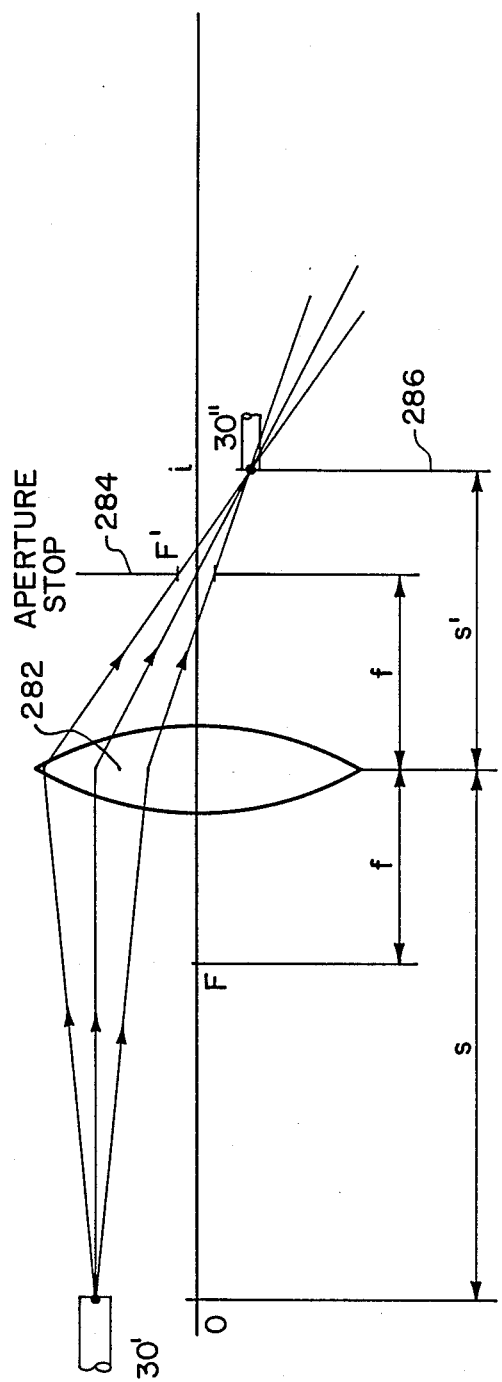
FIG. 11 is a schematic view of a simple telecentric system to illustrate the invention.

FIG. 11 is a schematic view of a simple telecentric system formed by a lens 282 and an aperture stop 284 placed at a focal point of lens 282 on the side of the lens away from the lead tip 30'. Light from lead tip 30' then forms an image 30" on a sensing array 286 behind the aperture stop. The aperture stop 284 limits the light passing through to beams originating from the lead tip 30' which are substantially parallel to the axis of lens 282. For this reason the size of image 30" on screen 286 remains the same irrespective of the distance between the lead tip 30' and lens 282 and screen 286. Therefore, the sensed distances between lead tips detected by the array 286 will not change on account of the variation in the separation between the array and the lead tips.

Figure 12:
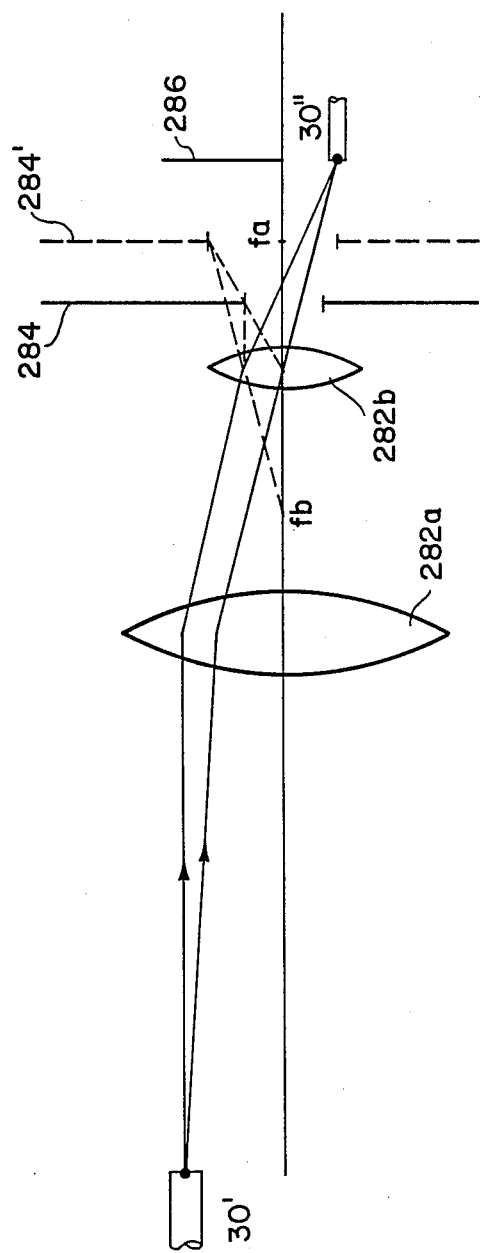
FIG. 12 is a schematic view of a compound telecentric system to illustrate the preferred embodiment of the invention.

FIG. 12 is a schematic view of a compound telecentric system comprising an auxiliary telecentric lens used together with a camera lens which is normally used within a camera such as camera 280. As shown in FIG. 12 an auxiliary lens 282a is used in conjunction with a camera lens 282b. The aperture stop 284, as viewed from between the two lenses, appears to be at 284'; in other words image 284' is a virtual image of stop 284. Thus, the two lens compound telecentric system of FIG. 12 becomes equivalent to that of FIG. 11 if the separation between the two lenses is adjusted so that the distance between the virtual stop 284' and lens 282a is equal to the focal length of lens 282a. Again, irrespective of the separation between lead tip 30' and lens 282a, 282b and array 286, the size of image 30" will not vary with such distance. As in all telecentric systems, the systems of FIGS. 11, 12 are subject to the condition that the lead tip rests within that portion of the object space for which the aperture stop is the limiting aperture of the system.

The above described system is merely illustrative of the invention and various changes in the details of the construction, method, and various algorithms may be within the scope of the appended claims.

What is claimed is:

1. A device for illuminating a planar region comprising means for providing a thin sheet of light in substantially isotropic directions towards said planar region from locations substantially coplanar with the planar region so that only the portion of an object in or near the plane of the planar region and the locations is illuminated without illuminating the remaining portion of the object and, wherein said light-providing means comprises three or more light sources, each providing a thin planar light beam.

2. The device of claim 1, wherein said light-providing means comprises:

three or more mirrors each at one of the locations and each for reflecting a planar light beam from a light source towards the planar region, said sources and mirrors being located so that the directions of the three or more thin planar light beams towards the planar region are approximately the isotropic directions.

3. The device of claim 2, wherein the three or more mirrors are substantially evenly spaced angularly around the planar region.

4. A device for illuminating a region comprising means for providing light in substantially isotropic directions towards said region from locations substantially coplanar with the regions so that only the portion of an object in or near the plane of the region and the locations is illuminated without illuminating the remaining portion of the object, wherein said light-providing means comprises:

three or more light sources, each providing a light beam; and three or more mirrors each at one of the locations and each for reflecting a light beam from a light source towards the region, said sources and mirrors being located so that the directions of the three or more light beams towards the region are approximately the isotropic directions, wherein the three or more light sources each provides a light beam in the shape of a narrow sheet, and wherein the mirrors are so located that the three or more beams reflected towards the region are in the shape of narrow sheets substantially in or near the plane of the region and the locations.

5. A method for illuminating a planar region comprising providing a thin sheet of light in substantially isotropic directions towards said planar region from locations substantially coplanar with the planar region so that only the portion of an object in or near the plane of the planar region and the locations is illuminated without illuminating the remaining portion of the object, wherein means for providing said thin sheet of light comprises three or more light sources, each providing a thin planar light beam.

* * * * *